(12) United States Patent
Igarashi et al.

(10) Patent No.: US 12,191,325 B2
(45) Date of Patent: Jan. 7, 2025

(54) APPARATUS, SYSTEM, AND MOVING BODY

(71) Applicant: CANON KABUSHIKI KAISHA, Tokyo (JP)

(72) Inventors: Kazuya Igarashi, Tokyo (JP); Hajime Ikeda, Kanagawa (JP); Shunichi Wakashima, Tokyo (JP); Kohei Okamoto, Kanagawa (JP); Koichi Fukuda, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 343 days.

(21) Appl. No.: 17/589,177

(22) Filed: Jan. 31, 2022

(65) Prior Publication Data
US 2022/0254820 A1 Aug. 11, 2022

(30) Foreign Application Priority Data
Feb. 5, 2021 (JP) .................................. 2021-017516

(51) Int. Cl.
*H01L 27/146* (2006.01)
(52) U.S. Cl.
CPC .. *H01L 27/14605* (2013.01); *H01L 27/14627* (2013.01); *H01L 27/1463* (2013.01); *H01L 27/14636* (2013.01)
(58) Field of Classification Search
CPC ......... H01L 27/14605; H01L 27/14627; H01L 27/1463; H01L 27/14636; H01L 27/14643; H01L 27/14623
See application file for complete search history.

(56) References Cited

U.S. PATENT DOCUMENTS

2017/0012066 A1* 1/2017 Choi .................. H01L 27/1463

FOREIGN PATENT DOCUMENTS

| JP | 2001237404 A | 8/2001 |
| JP | 2014116472 A | 6/2014 |
| JP | 2015065269 A | 4/2015 |
| JP | 2015216186 A | 12/2015 |
| JP | 2019140251 A | 8/2019 |

\* cited by examiner

*Primary Examiner* — Douglas W Owens
(74) *Attorney, Agent, or Firm* — Canon U.S.A., Inc. IP Division

(57) ABSTRACT

An apparatus includes pixels on a substrate. Each pixel includes a first portion, a second, and a microlens. The substrate has a first surface on an incidence side and a second surface opposite to the first surface, and includes an inter-pixel portion isolating adjacent pixels from each other, and an intra-pixel portion isolating the first and second portions from each other. The inter-pixel portion includes a first region located adjacently to the first surface, and a second region located adjacently to the second surface. The intra-pixel portion includes a third region located adjacently to the first surface, and a fourth region located adjacently to the second surface. The first and third regions are shifted with respect to the second and fourth regions, respectively, in an identical direction that is a direction orthogonal to a longitudinal direction of the intra-pixel portion in plan view from the first surface.

20 Claims, 16 Drawing Sheets

FIG. 1
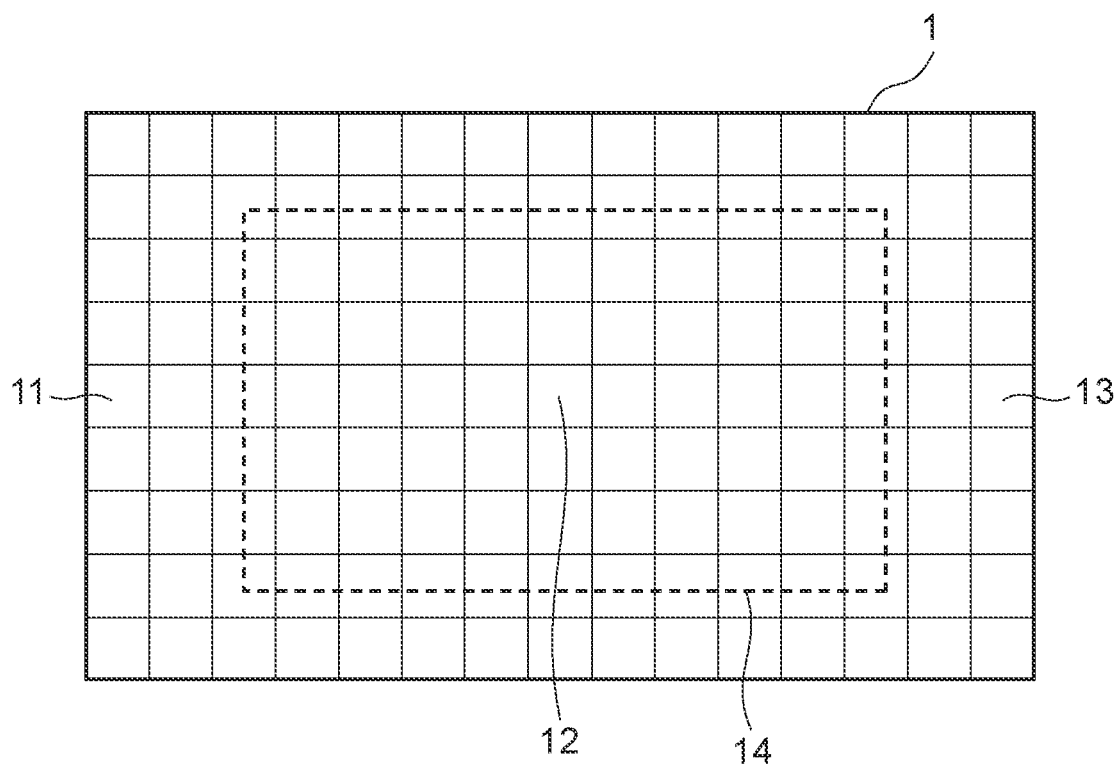
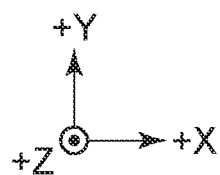

FIG. 5
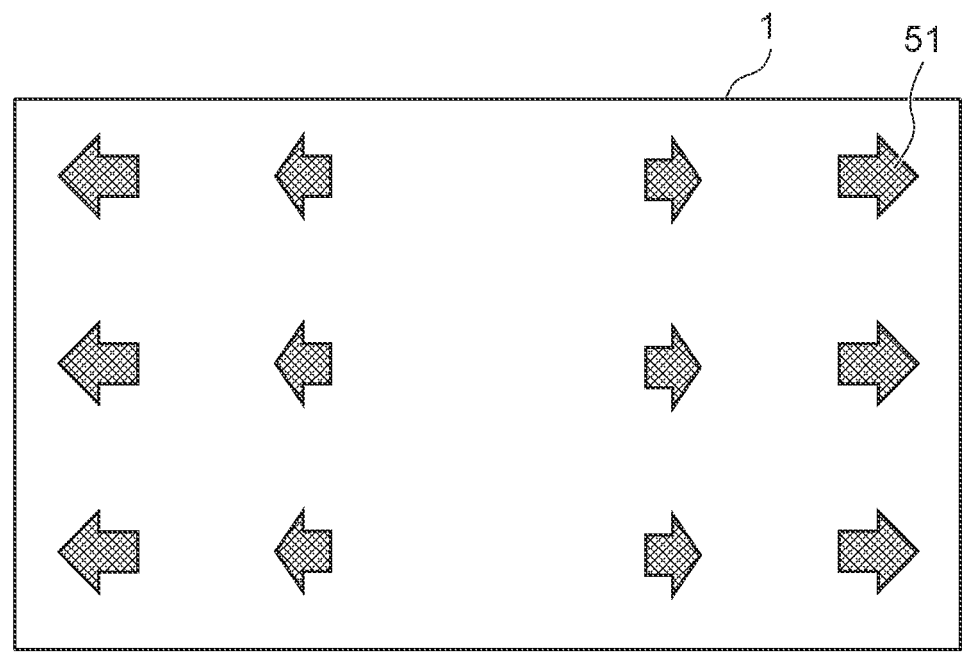
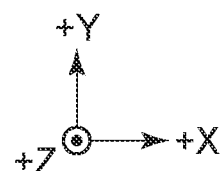

FIG. 6
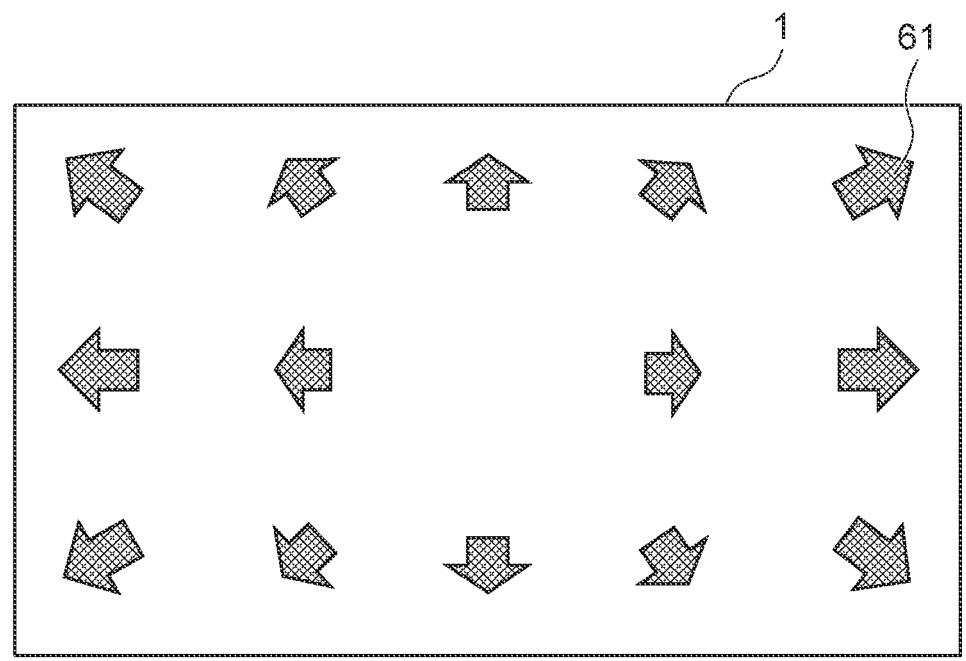
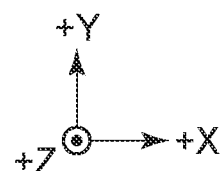

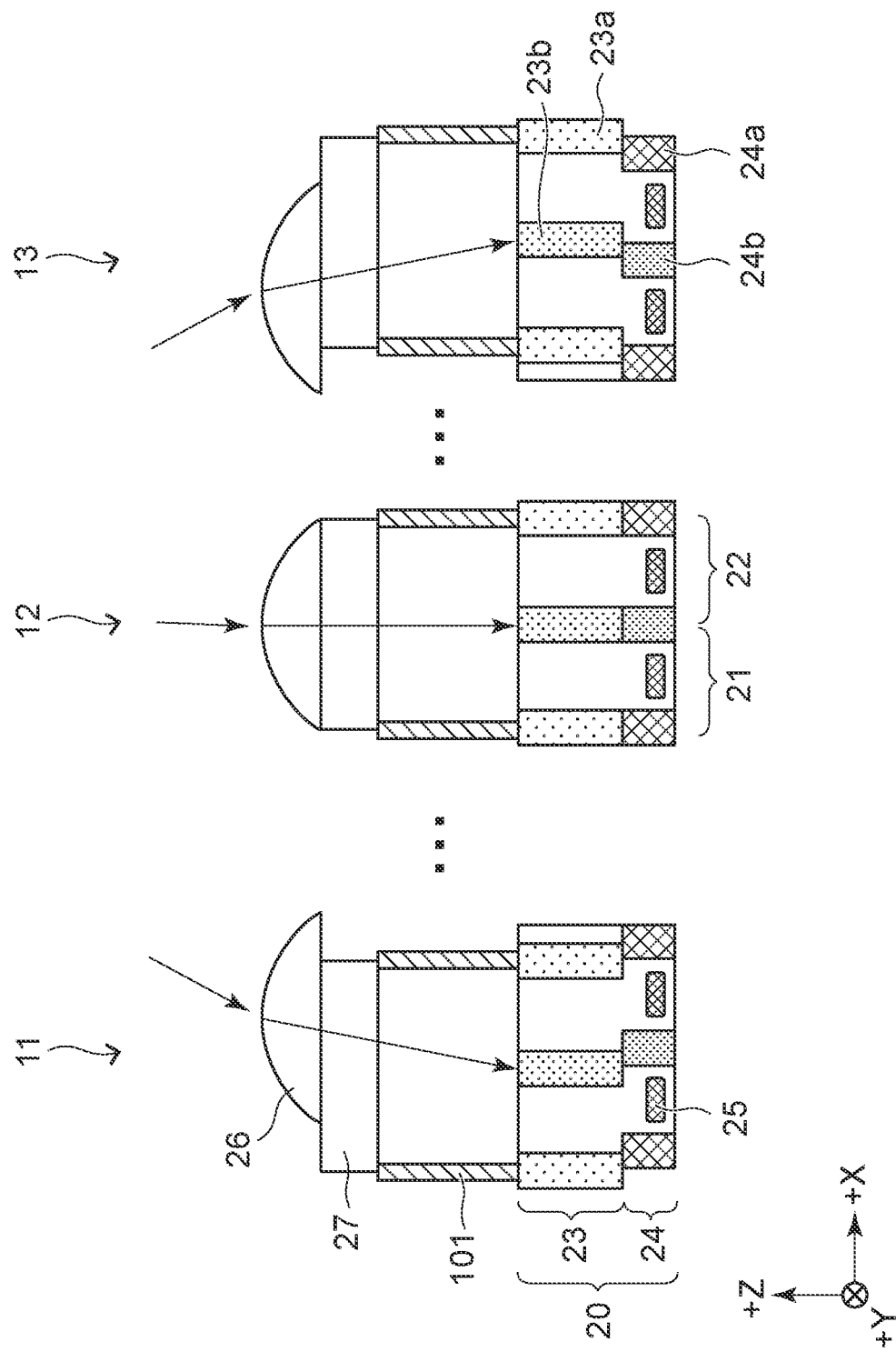

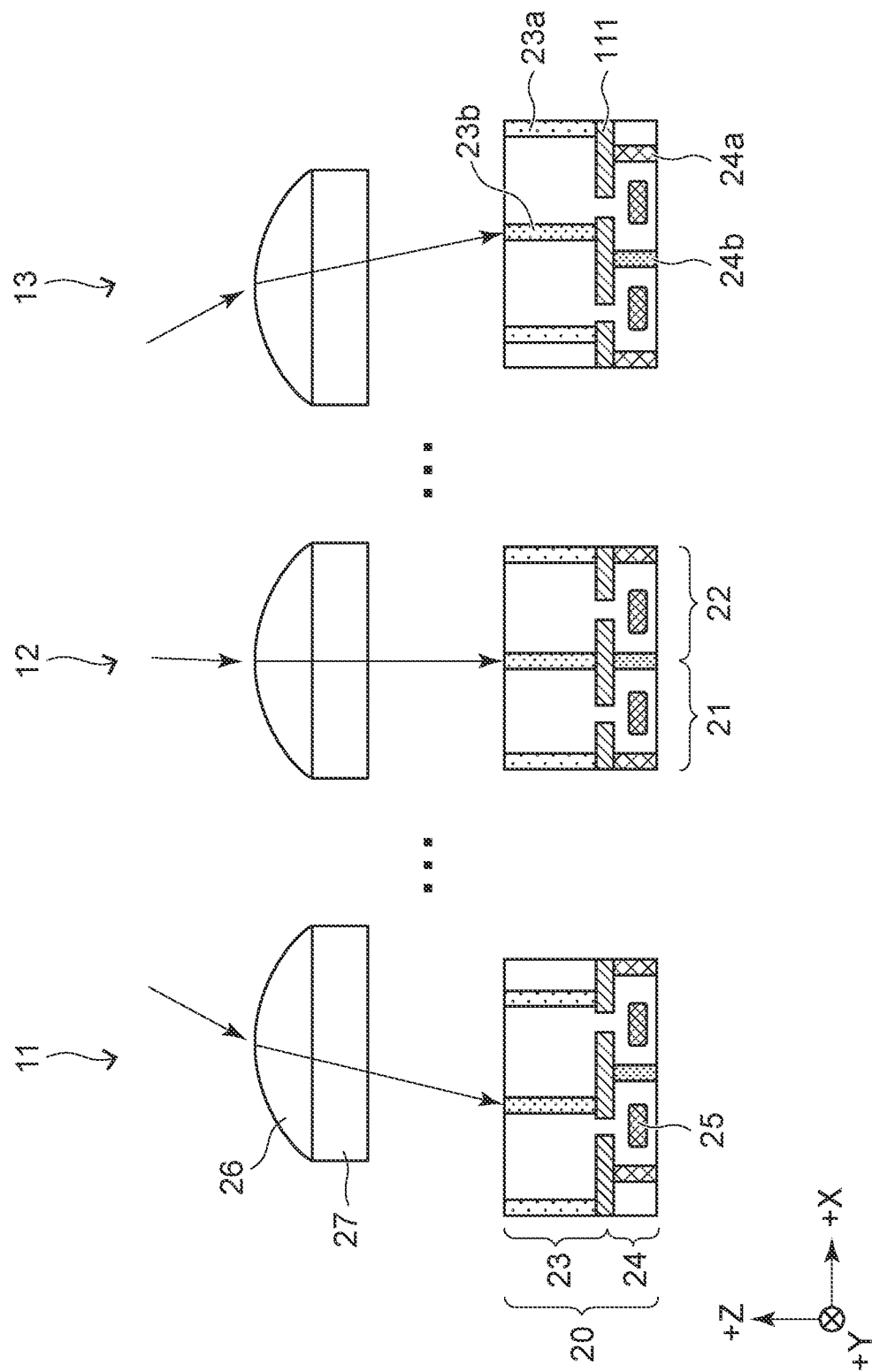

APPARATUS, SYSTEM, AND MOVING BODY

BACKGROUND

Field of the Disclosure

The aspect of the embodiment relates to a photoelectric conversion apparatus, a photoelectric conversion system including the photoelectric conversion apparatus, and a moving body including the photoelectric conversion apparatus.

Description of the Related Art

There is known technology for performing image-plane phase-difference autofocus (AF) with a plurality of separate photodiodes (hereinafter, also abbreviated as PDs) in each pixel of an image sensor. To obtain a sufficient phase-difference signal output from each of the PDs, design is to be made so that light is incident to the vicinity of the boundary of the separate PDs in the pixel.

In Japanese Patent Laid-Open No. 2015-65269, a method for aligning a light incidence position with a boundary of separate PDs by making sizes of the separate PDs different from each other has been proposed.

However, a size of a light incidence surface of a PD corresponds to an incident light angle range of light receivable by the PD. Therefore, the incident light angle range of light receivable by a PD whose light incidence surface is reduced in size in order to shift the boundary of the separate PDs narrows. This consequently leads to narrowing of an angle-of-incidence range of light that can be handled with image-plane phase-difference AF.

SUMMARY OF THE DISCLOSURE

An aspect of the embodiments provides an apparatus that includes a plurality of pixels on a substrate. Each of the plurality of pixels includes a first portion, a second portion, and a microlens. The substrate has a first surface on an incidence side and a second surface opposite to the first surface, and includes an inter-pixel portion isolating adjacent pixels from each other among the plurality of pixels, and an intra-pixel portion isolating the first portion and the second portion from each other. The inter-pixel portion includes a first region located adjacently to the first surface in plan view from the first surface, and a second region located adjacently to the second surface. The first region is shifted with respect to the second region. The intra-pixel portion includes a third region located adjacently to the first surface, and a fourth region located adjacently to the second surface. The third region is shifted with respect to the fourth region in a direction identical to a shift direction of the first region. The shift direction is a direction orthogonal to a longitudinal direction of the intra-pixel portion in plan view from the first surface.

Further features of the disclosure will become apparent from the following description of exemplary embodiments with reference to the attached drawings.

BRIEF DESCRIPTION OF THE DRAWINGS

FIG. 1 is a schematic diagram of an imaging region of a photoelectric conversion apparatus according to a first embodiment.

FIG. 5 is a diagram for describing how isolation regions are shifted according to the first embodiment.

FIG. 6 is a diagram for describing how the isolation regions are shifted according to the first embodiment.

FIG. 10 is a schematic diagram illustrating a cross section of pixels according to a third embodiment.

FIG. 11 is a schematic diagram illustrating a cross section of pixels according to a fourth embodiment.

DESCRIPTION OF THE EMBODIMENTS

Figure 2:
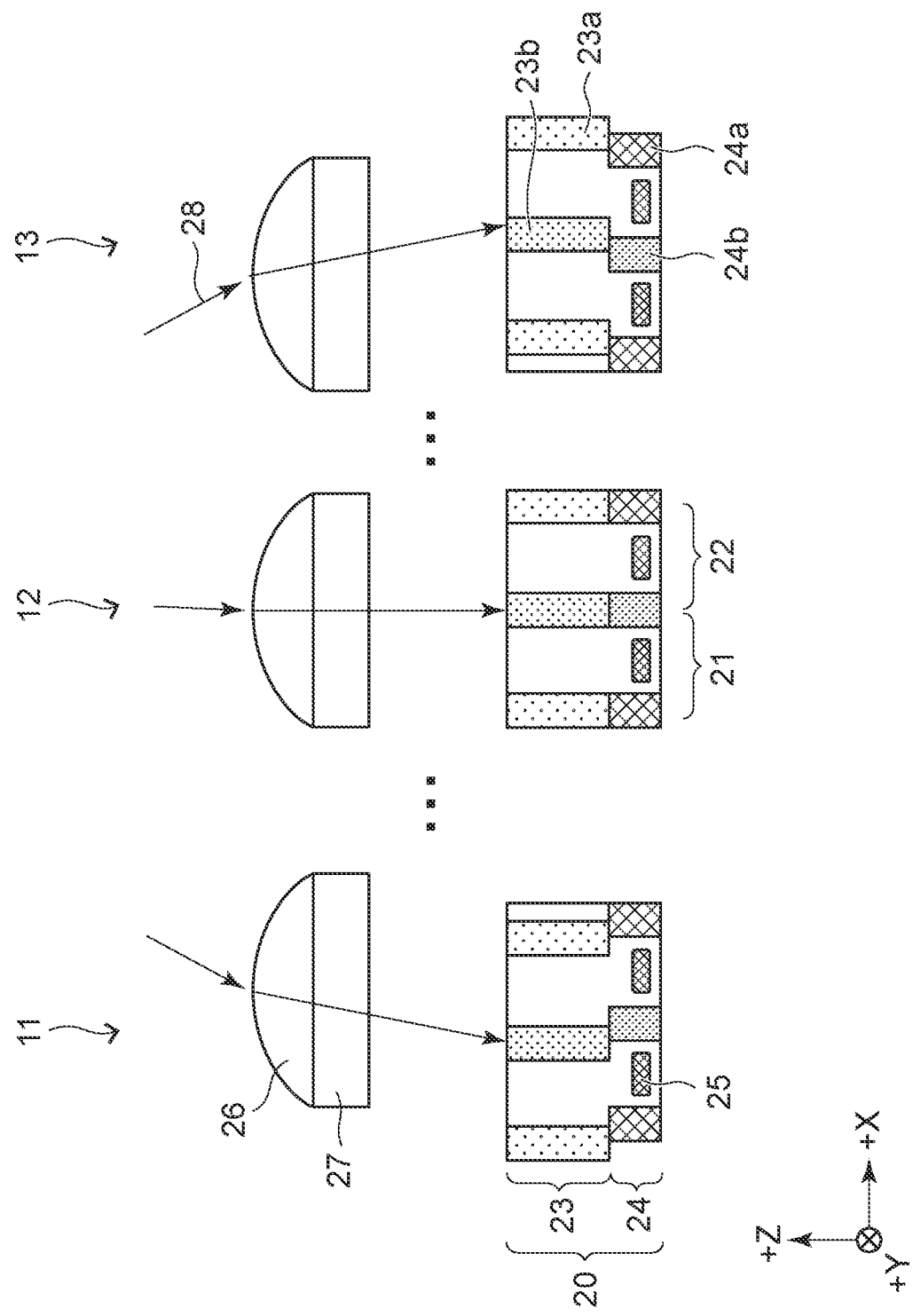
FIG. 2 is a schematic diagram illustrating a cross section of pixels according to the first embodiment.

A configuration of a photoelectric conversion apparatus according to a plurality of embodiments of the disclosure will be described.

In each of the embodiments described below, an imaging apparatus will be mainly described as an example of the photoelectric conversion apparatus. Note that the embodiments are not limited to the imaging apparatus and are applicable to other examples of the photoelectric conversion apparatus. The other examples include a ranging apparatus (an apparatus for focus detection, for distance measurement using time of flight (TOF), or the like), a light metering apparatus (an apparatus for incident light quantity measurement), etc.

Since each of the embodiments is part of the disclosure and can be appropriately modified, the disclosure is not limited to these embodiments. The plurality of embodiments may be combined together.

First Embodiment

FIG. 1 is a schematic diagram of an imaging region of a photoelectric conversion apparatus according to the present embodiment.

An imaging region 1 illustrated in FIG. 1 includes a plurality of pixels arranged in an array form. The plurality of pixels include a pixel 11 located in a peripheral portion on the left in the imaging region 1, a pixel 12 located in a central portion, and a pixel 13 located in the peripheral portion on the right. In the imaging region 1 illustrated in FIG. 1, the inside of a dashed line 14 is the central portion and the outside of the dashed line 14 is the peripheral portion. However, the central portion and the peripheral portion are not limited to those defined by the position of this dashed line 14. A portion that is peripheral relative to the central portion that is relatively close to the center is the peripheral portion. The plurality of pixels (pixel matrix) including the pixels 11 to 13 are on a semiconductor substrate (not illustrated).

The number of pixels constituting the imaging region 1 is not limited. For example, the imaging region 1 may be constituted by pixels of several thousands of rows×several thousands of columns as in a common digital camera or by a plurality of pixels arranged in one line.

FIG. 2 is a schematic diagram illustrating a cross section of pixels of the photoelectric conversion apparatus according to the first embodiment. The cross-sectional structures of the pixels 11, 12, and 13 will be described below.

Each of the pixels 11, 12, and 13 includes a microlens 26, a color filter 27, and a photodiode 20 in this order from a light incidence side (upper side in FIG. 2) of the pixel.

The photodiode 20 is divided by an isolation portion constituted by an isolation region 23b disposed on the light incidence side and an isolation region 24b disposed on a side opposite to the light incidence side into two portions on the left and right, which form a pair of a first photoelectric conversion portion 21 and a second photoelectric conversion portion 22. Reading can be performed separately on the first photoelectric conversion portion 21 and the second photoelectric conversion portion 22. Signals output from the first photoelectric conversion portion 21 and the second photoelectric conversion portion 22 are used in phase-difference AF. The signals output from the first photoelectric conversion portion 21 and the second photoelectric conversion portion 22 may be added together, and the resultant signal may be output as a captured image signal.

The photodiode 20 includes a photoelectric conversion portion including a charge generation region 23 and a charge accumulation region 24. The charge generation region 23 functions mainly to convert incident light into electrons or holes through photoelectric conversion. The charge accumulation region 24 functions mainly to accumulate electric charge generated in the charge generation region 23. The electric charge accumulated in the present embodiment is electrons. Thus, the charge accumulation region 24 includes an N-type impurity region 25 doped with an N-type impurity.

In the charge generation region 23, the isolation region 23b is at the boundary portion between the first photoelectric conversion portion 21 and the second photoelectric conversion portion 22. The isolation region 23b serves as an intra-pixel isolation portion to isolate the charge generation regions 23 from each other. In the charge accumulation region 24, the isolation region 24b is at the boundary portion between the first photoelectric conversion portion 21 and the second photoelectric conversion portion 22. The isolation region 24b serves as the intra-pixel isolation portion to isolate the charge accumulation regions 24 from each other.

Adjacent pixels are isolated from each other by an isolation portion constituted by an isolation region 23a and an isolation region 24a. Both the isolation region 23a and the isolation region 24a serve an inter-pixel isolation portion based on a potential barrier formed through doping with a P-type impurity, and isolate adjacent pixels from each other so that electric charge generated and accumulated in the individual pixels does not mix together.

The microlens 26 condenses incident light onto the photodiode 20.

In one embodiment, the color filter 27 transmits only light in a specific wavelength range to extract light of a specific color.

The photoelectric conversion apparatus according to the present embodiment is a back-illuminated sensor. Each of the plurality of pixels includes transistors for transferring, reading out, and resetting electric charge accumulated in the corresponding photodiode 20, drive lines, and output lines, and so on. Since these configurations are publicly known, detailed description and illustration are omitted herein.

Figure 3:
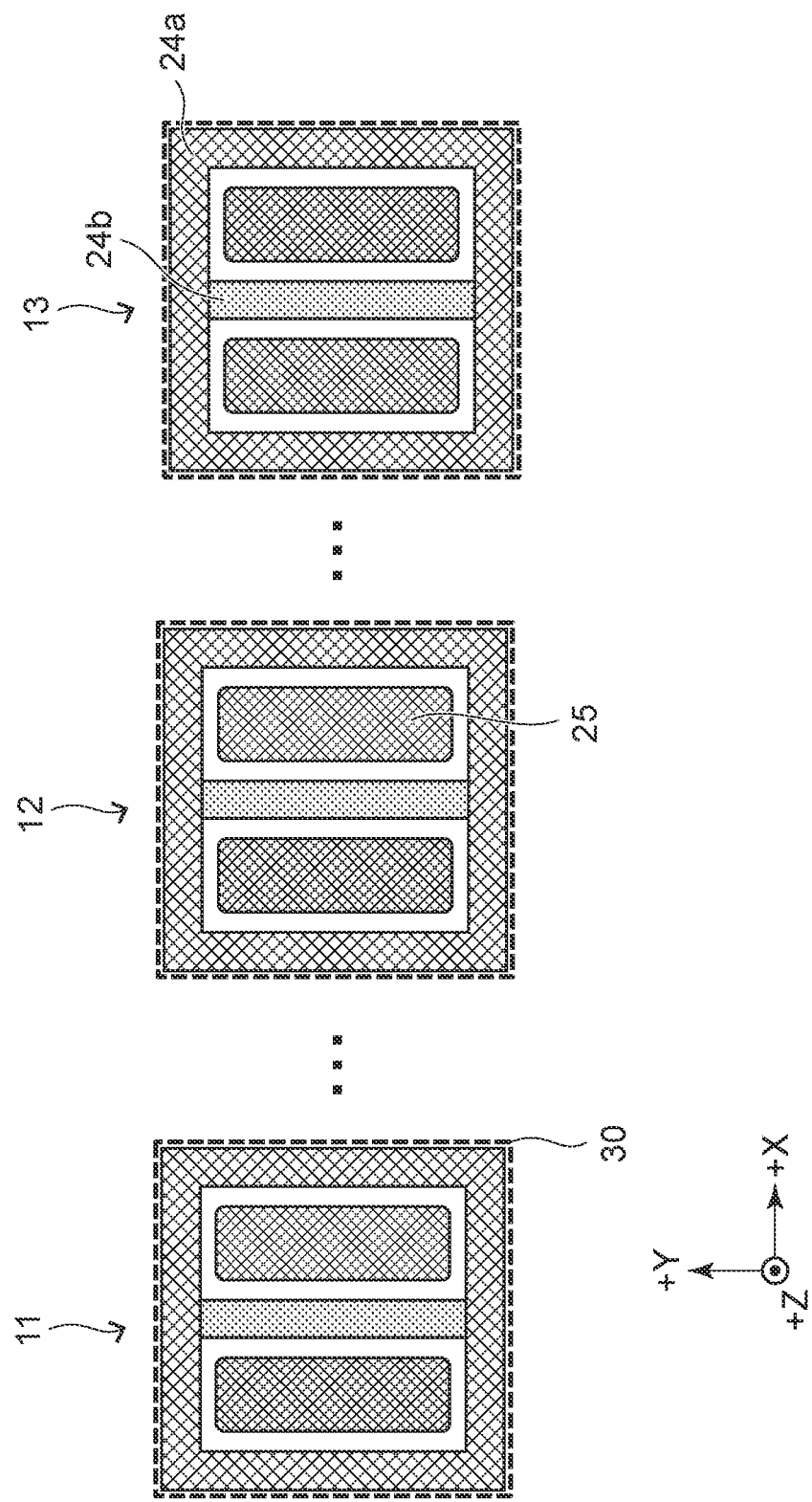
FIG. 3 is a schematic diagram of charge accumulation regions according to the first embodiment.

FIG. 3 is a schematic diagram of the charge accumulation regions 24, corresponding to the respective pixels 11 to 13, viewed from the light incidence side of the pixels 11 to 13.

The isolation region 24b is at the boundary portion of the first photoelectric conversion portion 21 and the second photoelectric conversion portion 22. The isolation region 24a is at the boundary portion between the corresponding pixel and adjacent pixels. A section 30 represents a section of the charge accumulation region 24 equivalent to a single pixel. In this case, relative positions of the isolation region 24a and the isolation region 24b in the section 30 of the charge accumulation region 24 equivalent to a single pixel are the same for the plurality of pixels including the pixels 11 to 13.

The term "same position" refers to, for example, a state in which the isolation region 24a coincides with the section 30 in plan view and the isolation region 24b is at a position where the section 30 is divided into two portions in each of the pixels 11, 12, and 13.

Figure 4:
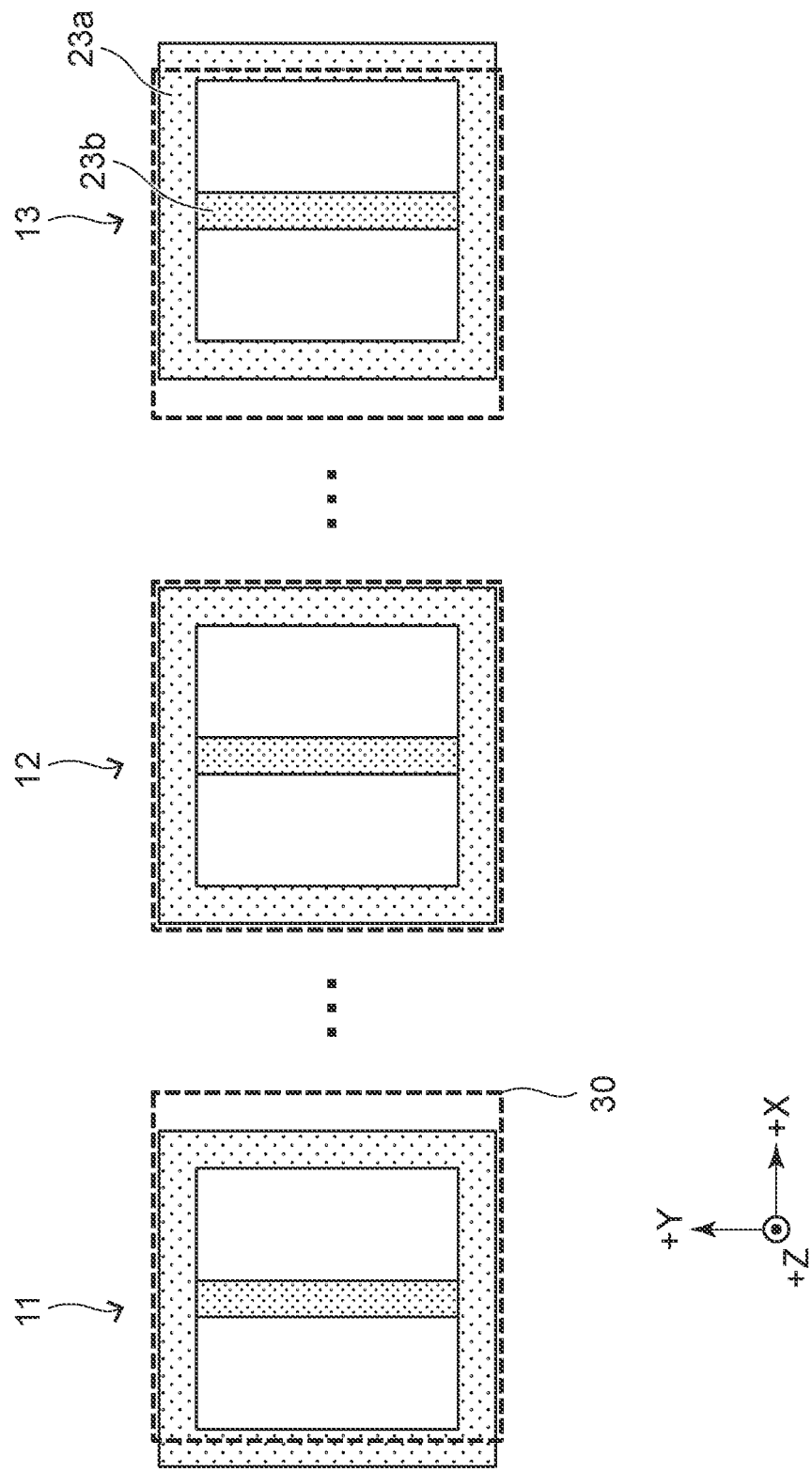
FIG. 4 is a schematic diagram of charge generation regions according to the first embodiment.

FIG. 4 is a schematic diagram of the charge generation regions 23 of the respective pixels 11 to 13, viewed from the light incidence side of the pixels 11 to 13.

In FIG. 4, the isolation region 23b is at the boundary portion of the first photoelectric conversion portion 21 and the second photoelectric conversion portion 22 of each pixel. The isolation region 23a is at the boundary portion between each pixel and the adjacent pixels. As compared with the positions of the isolation regions 23a and 23b in the pixel 12, the isolation regions 23a and 23b in each of the pixels 11 and 13 are shifted with respect to the section 30 of the charge accumulation region 24 equivalent to a single pixel in a shift direction by a shift amount, the shift direction and the shift amount corresponding to an image height of the pixel.

Herein, the term "image height" refers to a distance from the center of the imaging region 1 (a distance from the pixel 12 in FIG. 1).

Specifically, in the pixel 12 located in the central portion of the imaging region 1, incident light enters the microlens 26 perpendicularly. Thus, most incident light from the microlens 26 enters the isolation region 23b. The isolation regions 23a and 24a are at positions where they entirely coincide with each other in plan view from the light incidence side and are not shifted from each other. In addition, the isolation regions 23b and 24b are at positions where they entirely coincide with each other in plan view from the light incidence side and are not shifted from each other.

In the pixel 11 located in the peripheral portion on the left (in the −X direction) in the imaging region 1 and in the pixel 13 located in the peripheral portion on the right (in the +X direction) in the imaging region 1, an angle of light incident onto the pixels 11 and 13 increases. Thus, the isolation region 23b is shifted in accordance with the image height of the corresponding pixel so that the incident light hits the isolation region 23b. To receive such diagonally incident light, the isolation region 23b of the pixel 11 and the isolation region 23b of the pixel 13 are respectively shifted in the −X direction and the +X direction with respect to the isolation region 24b to become away from the center of the imaging region 1. Thus, the isolation region 23b and the isolation region 24b do not entirely coincide with each other in plan view.

By shifting the isolation region 23b with respect to the isolation region 24b in this manner, incident light can be caused to hit the isolation region 23b. Consequently, a sufficient phase-difference AF signal can be obtained with each of the first photoelectric conversion portion 21 and the second photoelectric conversion portion 22. By shifting also the isolation region 23a at the same time, areas of light incidence surfaces of the first photoelectric conversion portion 21 and the second photoelectric conversion portion 22 (areas of light-receiving surfaces of charge generation regions) can be made uniform. Since the arrangement of the isolation region 24a is constant regardless of the position of the corresponding pixel in the imaging region 1, the arrangement of the transistors of the pixel need not be changed from pixel to pixel. Thus, a wiring layer can be readily designed and fabricated in certain repetition units.

The shift direction and the shift amount of the isolation regions 23a and 23b in the imaging region 1 will be described next with reference to FIGS. 5 and 6.

As for the shift direction, for example, the case of shifting the isolation regions 23a and 23b only in the X direction as illustrated in FIG. 5 is conceivable. In the case illustrated in FIG. 5, the shift amount is in direct proportion to a distance from the center of the imaging region 1 in the X direction and continuously increases as the position of the pixel becomes away from the center of the imaging region 1.

The shift direction of the isolation region 23a is not limited to the X direction. The isolation region 23a may be shifted so that the charge generation region 23 is at a condensation position of incident light that enters through the microlens 26.

The condensation position of the diagonally incident light is determined by an angle of incidence and an angle of direction. For example, depending on the angle of incidence and the angle of direction of the incident light, the isolation region 23a may be shifted toward the center of the imaging region 1 or may be shifted radially from the central portion of the imaging region 1 as illustrated in FIG. 6.

In such shifting, the shift amount and the shift direction are changed in units of rows or columns of the imaging region 1. However, the shift amount of the isolation region 23a is not limited to the case of being in direct proportion to the distance from the center of the imaging region. The shift amount and the shift direction of the isolation region 23a may be appropriately adjusted in accordance with the angle of incidence of the incident light in each pixel in the imaging region 1. For example, the imaging region 1 may be divided into a plurality of sub-regions, and the shift amount may be set constant in each of the sub-regions. The aforementioned regions in units of rows or columns of the imaging region 1 are one form of these sub-regions.

An arrangement is also conceivable in which the isolation region 23a is shifted in the imaging region peripheral portion where the angle of incidence of the incident light is large and the isolation region 23a is not shifted in the imaging region central portion where the most incident light enters perpendicularly onto the light-receiving surfaces of the photoelectric conversion portions.

When the isolation region 23a is shifted, a connecting portion where the isolation region 23a overlaps the isolation region 24a in a depth direction of the substrate is left. That is, a continuous isolation portion that isolates the photoelectric conversion portion from a first surface, on an incident surface side, of the photoelectric conversion portion to a second surface opposite to the first surface is formed, by leaving the connecting portion of the isolation region 23a and the isolation region 24a so that the isolation region 23a and the isolation region 24a coincide with each other in plan view from the light incidence side.

The reason for this is that if a leakage path of electric charge is caused between the isolation region 23a and the isolation region 24a as a result of the isolation region 23a being shifted greatly, leakage of electric charge generated through photoelectric conversion to the adjacent pixels, i.e., color mixture, occurs, leading to degradation of the image quality. By employing the configuration described in the present embodiment, such color mixture can be reduced.

As in the case where the isolation region 23a is shifted, when the isolation region 23b is shifted, a connecting portion of the isolation region 23b and the isolation region 24b is left so that the isolation region 23b coincides with the isolation region 24b in plan view from the light incidence side. The reason for this is that if a leakage path of electric charge is caused between the isolation region 23b and the isolation region 24b, so-called crosstalk in which a signal that is supposed to be read from the first photoelectric conversion portion 21 is read from the second photoelectric conversion portion 22 occurs, leading to degradation of the accuracy of phase-difference AF.

Note that implementation of the embodiment of the disclosure as a front-illuminated sensor is not excluded. Thus, the embodiment of the disclosure may be applied to a front-illuminated sensor if an advantage of the embodiment of the disclosure is obtained.

The shift direction of the charge generation region 23 is a direction in which the first photoelectric conversion portion 21 and the second photoelectric conversion portion 22 are arranged side by side in the charge generation region 23. That is, the shift direction is a direction that is orthogonal to a longitudinal direction of the isolation region 23b that isolates the first photoelectric conversion portion 21 and the second photoelectric conversion portion 22 from each other.

In the present embodiment, since the first photoelectric conversion portion 21 and the second photoelectric conversion portion 22 are arranged side by side in the X direction, the isolation region 23b is shifted in the X direction. However, the shift direction is not limited to this direction.

In the present embodiment, the shift amount of the isolation region 23a and the shift amount of the isolation region 23b are substantially equal but need not be equal. However, when the shift amounts of the isolation regions 23a and 23b differ from each other, a width of the charge generation region 23 is reduced in one of the first photoelectric conversion portion 21 and the second photoelectric conversion portion 22. Consequently, the angle range in which light can be incident narrows. For this reason, the shift amount of the isolation region 23a and the shift amount of the isolation region 23b are equal as in the present embodiment.

In the photoelectric conversion apparatus configured in the above-described manner, the charge accumulation region 24 is structured in the same manner in all the pixels in the imaging region 1. Thus, the saturation charge quantity, the charge transfer characteristics, and the like can be made uniform in the imaging region 1. Consequently, degradation of the image quality because of the occurrence of uneven amounts of signals in the imaging region 1 can be suppressed.

Note that in the present embodiment, the single isolation region 23a is used for isolating the adjacent charge generation regions 23 from each other. However, for example, a plurality of isolation regions arranged in the depth direction of the substrate may be used instead of the single isolation region 23a. These plurality of isolation regions may be shifted with respect to the isolation region 24a in a direction orthogonal to the depth direction by amounts different from each other. For example, a configuration is conceivable in which the plurality of isolation regions are continuous in a stepped manner from the first surface to the second surface.

By dividing the isolation region 23a into a plurality of portions in this manner, overlapping of the upper and lower isolation regions can be maintained without increasing the width of the isolation region even when the isolation region 23a is shifted greatly with respect to the isolation region 24a. Thus, crosstalk can be reduced while maintaining the areas of the photoelectric conversion portions, and degradation of the image quality can be avoided.

As for the charge generation region 23, since the isolation region 23b is shifted in accordance with the angle of incidence on the photoelectric conversion portions in each pixel in the peripheral portion of the imaging region 1, light from which a sufficient phase-difference signal output is obtained can be received also in the peripheral portion of the imaging region 1, thus contributing to improvement of the AF performance.

Further, the areas of the light incidence surfaces of the first photoelectric conversion portion 21 and the second photoelectric conversion portion 22 (areas of the light-receiving surfaces of the charge generation regions 23) are equal to each other even when the isolation region 23b is shifted in order to receive the diagonally incident light. Thus, a phase-difference signal can be obtained. Therefore, a photoelectric conversion apparatus can be provided which has a wide incident light angle range in which the phase-difference signal can be obtained even when the angle of incidence of the diagonally incident light is large.

Second Embodiment

Figure 7:
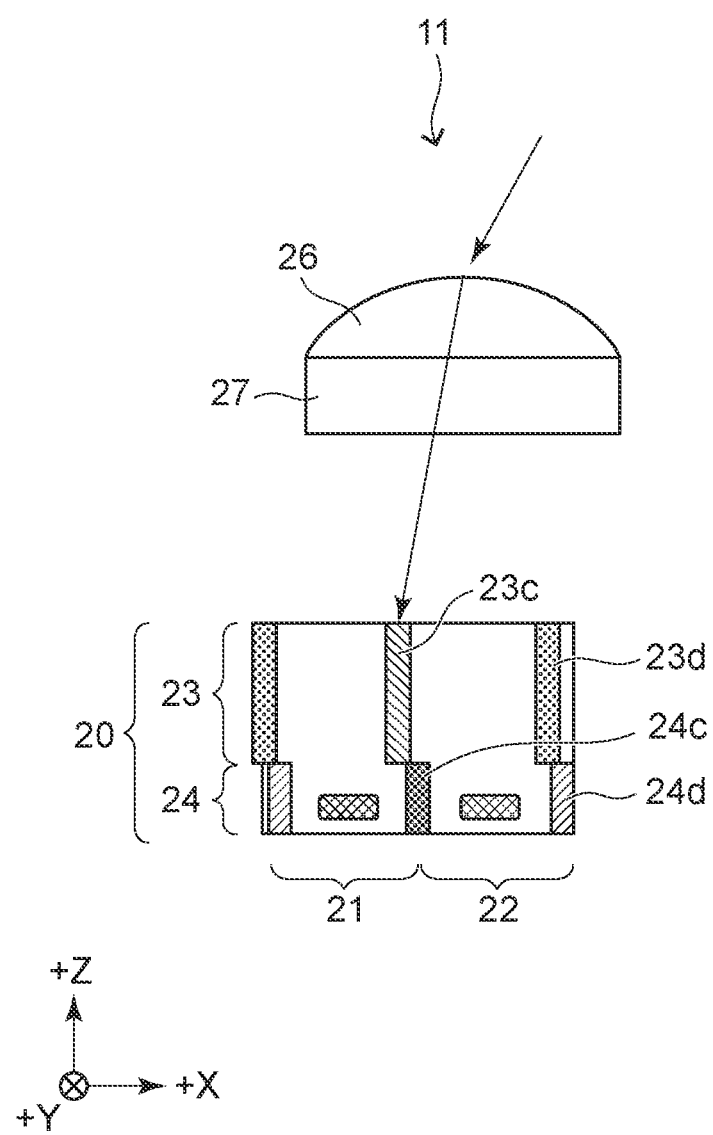
FIG. 7 is a schematic diagram illustrating a cross section of a pixel according to a second embodiment.

FIG. 7 is a schematic diagram of a photoelectric conversion apparatus according to a second embodiment. Hereinafter, description regarding the configuration that is common to the first embodiment is omitted, and differences from the first embodiment will be mainly described.

In the first embodiment, potential barriers formed by doping the photoelectric conversion portion with an impurity are used as the isolation regions 23a and 23b and the isolation regions 24a and 24b. However, instead of the potential barriers formed by an impurity, trenches formed as grooves (cavities) or trenches formed by embedding an oxide film in grooves may be used.

FIG. 7 illustrates the pixel 11 in the case where all the isolation portions are formed as trench isolation regions.

Isolation regions 23c and 23d are trenches each of which is formed by embedding an oxide film in a groove formed through etching from a surface of the substrate adjacent to the charge generation region 23. Isolation regions 24c and 24d are also trenches each of which is formed by embedding an oxide film in a groove formed through etching from a surface of the substrate adjacent to the charge accumulation region 24.

Other than the oxide film, the film embedded in the groove of the trench may be a nitride film or a metal film, or the inside the groove of the trench may be left as a cavity without embedding these films. The isolation portions formed as trenches are for suppressing crosstalk of electric charge between adjacent photoelectric conversion portions just like the isolation portions formed by an impurity. Thus, no gap is present between the isolation regions 23c and 24c and between the isolation regions 23d and 24d.

In FIG. 7, all the isolation portions are trenches. However, the structure of the isolation portions is not limited to the structure that uses either trenches or potential barriers formed by an impurity and may be a structure that uses the trenches and the potential barriers formed by an impurity in combination as illustrated in FIGS. 8 and 9.

Figure 8:
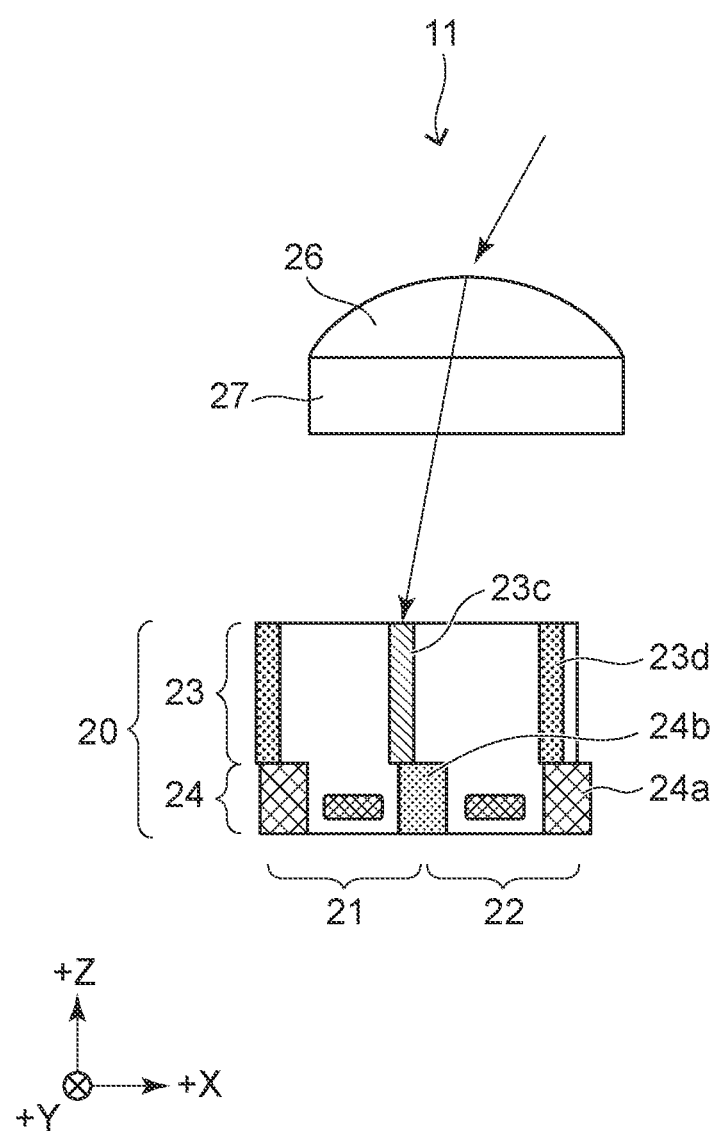
FIG. 8 is a schematic diagram illustrating a cross section of the pixel according to the second embodiment.

FIG. 8 is a schematic diagram of a configuration in which isolation regions each having a potential barrier formed by an impurity are formed in the charge accumulation region 24 and isolation regions each formed as a trench are formed in the charge generation region 23.

Figure 9:
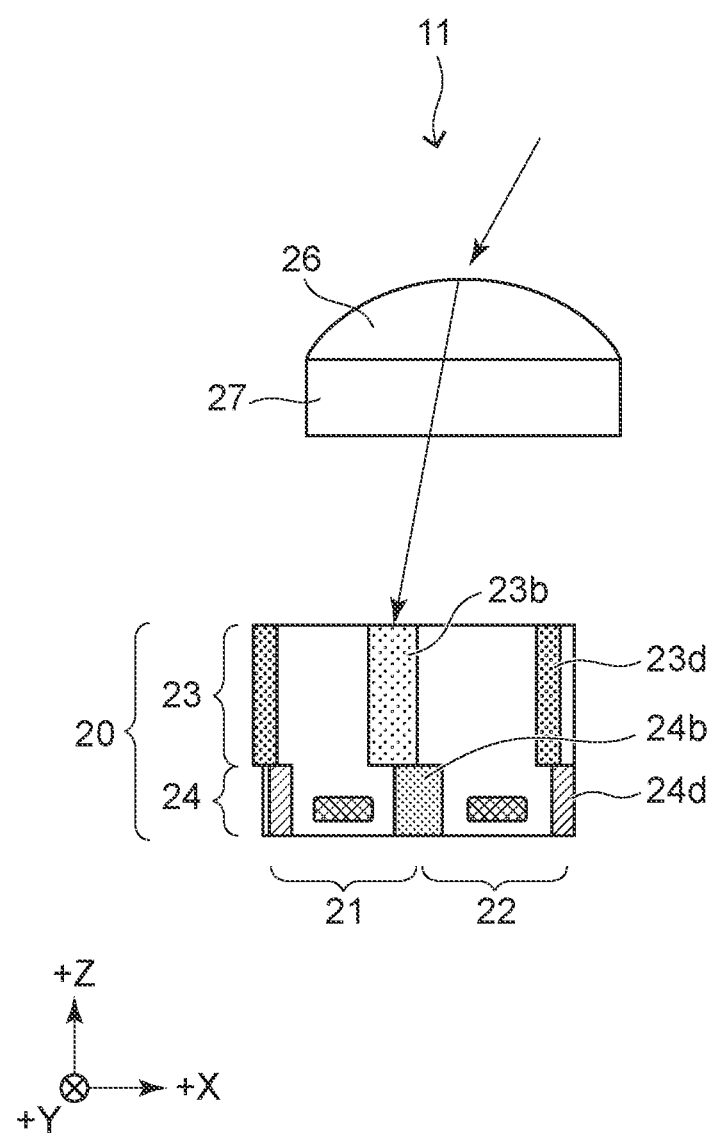
FIG. 9 is a schematic diagram illustrating a cross section of the pixel according to the second embodiment.

FIG. 9 is a schematic diagram of a configuration in which the first photoelectric conversion portion 21 and the second photoelectric conversion portion 22 that constitute a single pixel are isolated from each other by a potential barrier formed by an impurity and adjacent pixels are isolated from each other by a trench.

With any of the configurations illustrated in FIGS. 8 and 9, a photoelectric conversion apparatus can also be provided which is capable of obtaining a phase-difference signal for incident light of a wide angle range from light that is incident perpendicularly to light that is incident at a large angle of incidence as described in the first embodiment.

In FIGS. 8 and 9, a single isolation region in the charge generation region 23 and a single isolation region in the charge accumulation region 24 correspond to each other. However, a plurality of isolation regions that partially overlap one another in the depth direction of the substrate may be provided in one of or both of the charge generation region 23 and the charge accumulation region 24. These plurality of isolation regions may have a combinational structure of an isolation region having a potential barrier formed by an impurity and an isolation region formed as a trench.

Third Embodiment

FIG. 10 is a schematic diagram of a photoelectric conversion apparatus according to a third embodiment. Hereinafter, description regarding the configuration that is common to the first embodiment is omitted, and differences from the first embodiment will be mainly described.

In FIG. 10, a light-shielding wall 101 that hinders leakage of light to adjacent pixels is provided between the photodiode 20 and the microlens 26 in the photoelectric conversion apparatus. The present embodiment is characterized in that the light-shielding wall 101 is added to the structure according to the first embodiment illustrated in FIG. 2. The light-shielding wall 101 is formed of a metal that does not transmit light of a color extracted by the color filter 27 so as to suppress color mixture to adjacent pixels.

In the present embodiment, the isolation region 23a and the isolation region 23b are shifted with respect to the charge accumulation region 24 in a direction away from the center of the imaging region 1 in pixels in the peripheral portion of the imaging region 1. The isolation region 23a substantially defines the charge generation region 23 of a single pixel in which photoelectric conversion occurs.

Thus, the light-shielding wall 101 located above the photodiode 20 is also shifted by the same amount in the same direction as the isolation region 23a. The light-shielding wall 101 of the present embodiment is formed to be shifted with respect to the charge accumulation region 24 so that the light-shielding wall 101 overlaps the isolation region 23a.

For the same reason, the color filter 27 located above the light-shielding wall 101 is also shifted by the same amount in the same direction as the isolation region 23a.

In the present embodiment, the light-shielding wall 101 and the color filter 27 are disposed between the photodiode 20 and the microlens 26. When another optical structure such as an interlayer lens is located between the photodiode 20 and the microlens 26, the optical structure is also shifted in the same manner By shifting an optical structure located above the photoelectric conversion portions in this manner, the occurrence of leakage of light to adjacent pixels from a portion between the light-shielding wall 101 and the isolation region 23a or a portion between the color filter 27 and the light-shielding wall 101 can be avoided.

Fourth Embodiment

FIG. 11 is a schematic diagram of a photoelectric conversion apparatus according to a fourth embodiment. Hereinafter, description regarding the configuration that is common to the first embodiment is omitted, and differences from the first embodiment will be mainly described.

In FIG. 11, an isolation portion 111 is added between the charge generation region 23 and the charge accumulation region 24 of the first embodiment illustrated in FIG. 2.

The isolation portion 111 is a potential barrier formed through doping with a P-type impurity. The charge generation region 23 and the charge accumulation region 24 are partially isolated from each other by this potential barrier. Not-isolated regions are regions that are not doped with any impurity and that are located at portions of the respective photoelectric conversion portions so that electric charge can move from the charge generation region 23 to the charge accumulation region 24. The regions not doped with any impurity may have a circular shape or a slit-like elongated shape when viewed in a Z direction.

The isolation portion 111 functions as an isolation region that links the isolation regions 23a and 24a to each other and links the isolation regions 23b and 24b to each other even when the isolation regions 23a and 23b are greatly shifted and the isolation regions 23a and 23b no longer coincide with the isolation regions 24a and 24b, respectively, in plan view from the light incidence side. Thus, a leakage path of electric charge to adjacent photoelectric conversion portion is not caused even when an angle of incident light to the microlens 26 is large and the isolation regions 23a and 23b are to be shifted by an amount greater than the widths of the isolation regions 23a and 23b.

According to the present embodiment, the range of the angle of incidence of the incident light in which a phase-difference signal can be obtained can be maximized while suppressing crosstalk between the photoelectric conversion portions.

Fifth Embodiment

A fifth embodiment will be described with reference to FIGS. 12A to 14C. Hereinafter, description regarding the configuration that is common to the first embodiment is omitted, and differences from the first embodiment will be mainly described.

An interchangeable lens camera performs phase-difference AF accurately even when any lens among a plurality of kinds of imaging lenses with exit pupil positions different from each other with respect to a single photoelectric conversion apparatus is attached thereto.

Figure 12C:
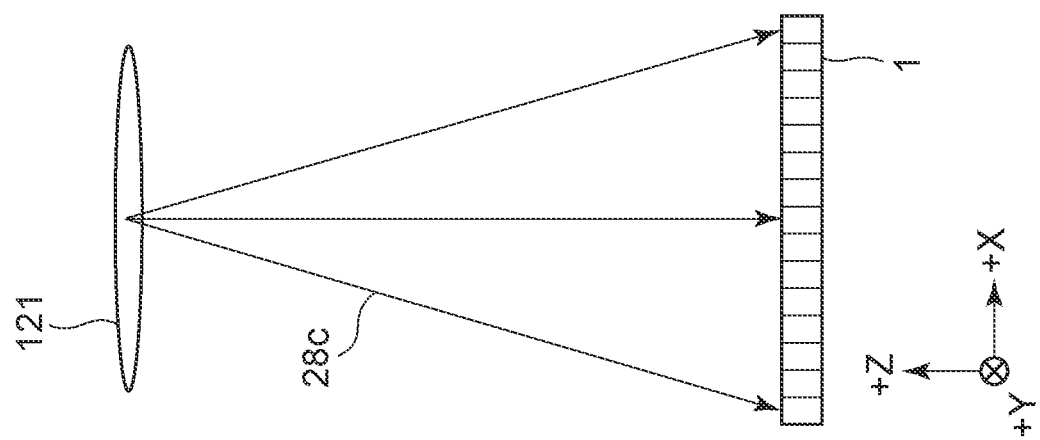
FIGS. 12A to 12C are diagrams for describing a difference in angle of incident light according to a fifth embodiment.
Figure 12B:
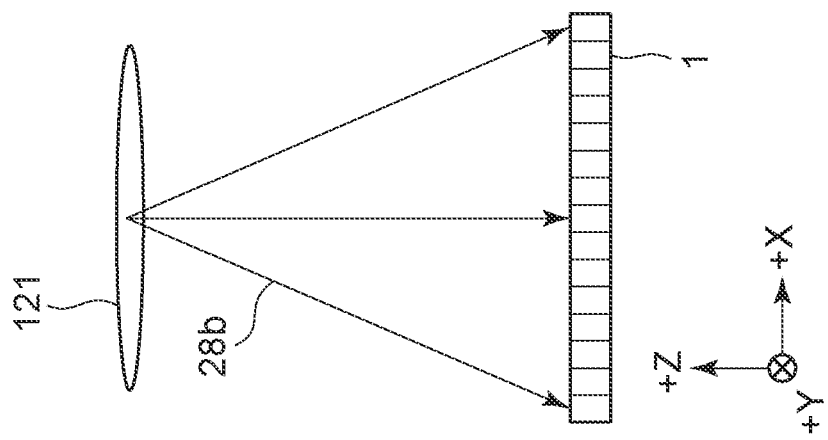
Figure 12A:
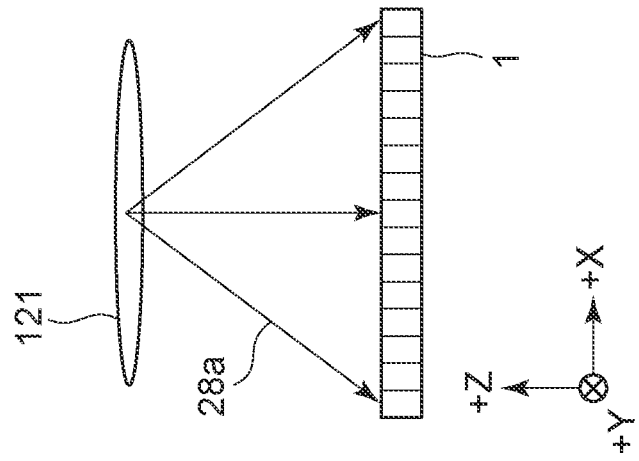

FIGS. 12A to 12C are diagrams for describing that the angle at which light is incident onto pixels in the peripheral portion of the imaging region 1 varies depending on the type of the imaging lens. FIG. 12A illustrates the case where a distance (hereinafter, referred to as a pupil distance) between an exit pupil 121 of the imaging lens and the imaging region 1 is short. FIG. 12B illustrates the case where the pupil distance is medium. FIG. 12C illustrates the case where the pupil distance is long. Light beams 28a, 28b, and 28c are main light beams in the respective cases.

In the case where the pupil distance is short (FIG. 12A), the main light beams 28a are diagonally incident onto peripheral pixels.

In the case where the pupil distance is long (FIG. 12C), the main light beams 28c are incident onto peripheral pixels at an angle relatively close to the right angle.

To maintain the accuracy of phase-difference AF for various pupil distances from the short distance to the long distance, the shift direction and the shift amount of the isolation regions 23a and 23b are changed in units of rows of a pixel matrix that constitutes the imaging region 1 in the present embodiment. Each row in this case is referred to as a phase-difference AF row.

The specific shift direction and shift amount of the isolation regions will be described with reference to FIGS. 13 to 14C.

Figure 13:
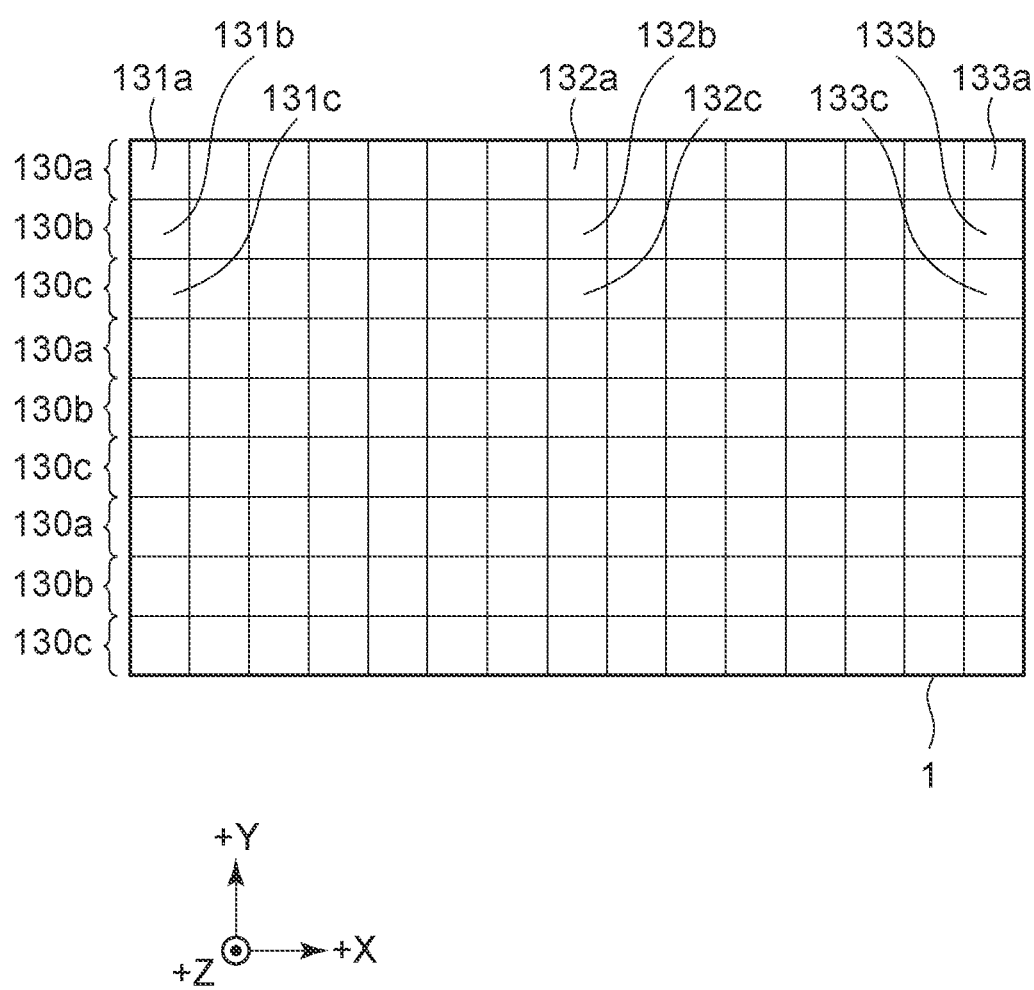
FIG. 13 is a schematic diagram of an imaging region of a photoelectric conversion apparatus according to the fifth embodiment.
Figure 14A:
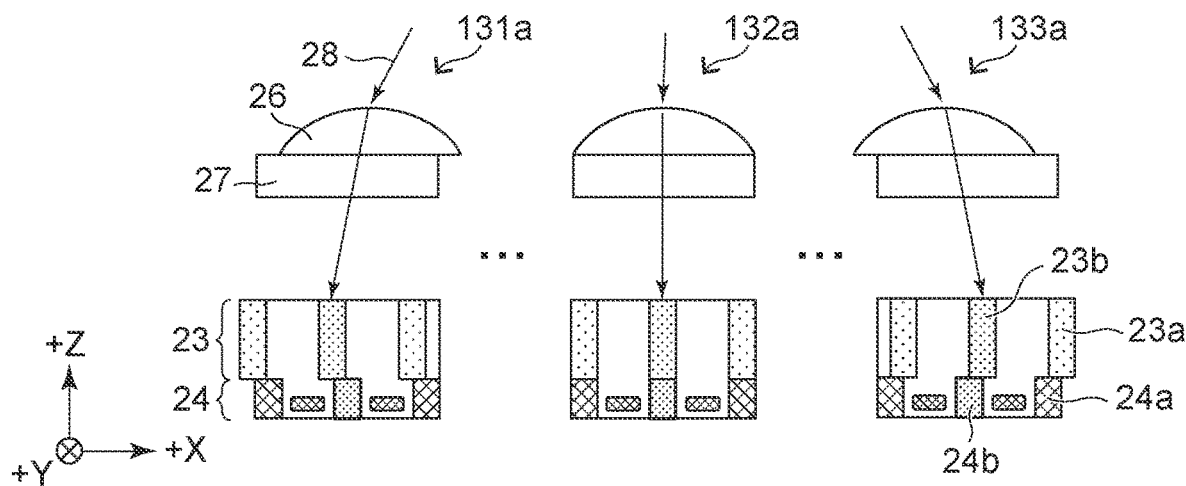
FIGS. 14A to 14C are schematic diagrams each illustrating a cross section of pixels according to the fifth embodiment.

A pixel row 130a in FIG. 13 is a phase-difference AF row for which the shift direction and the shift amount of the isolation regions 23a and 23b are optimized for the lens with the short pupil distance illustrated in FIG. 12A. As illustrated in FIG. 14A, the isolation regions 23a and 23b are shifted to become away from the central portion of the imaging region 1.

Figure 14B:
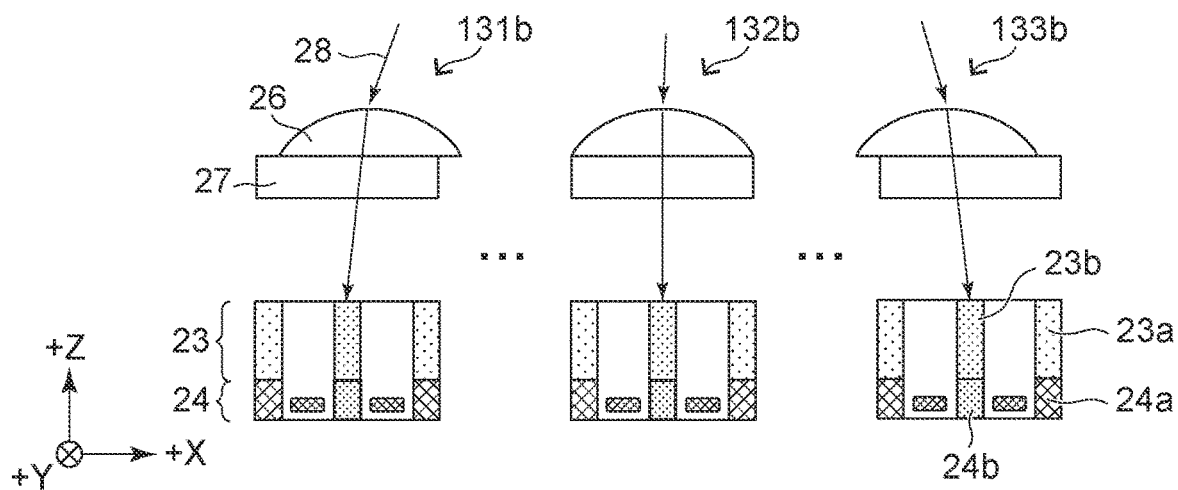
Figure 14C:
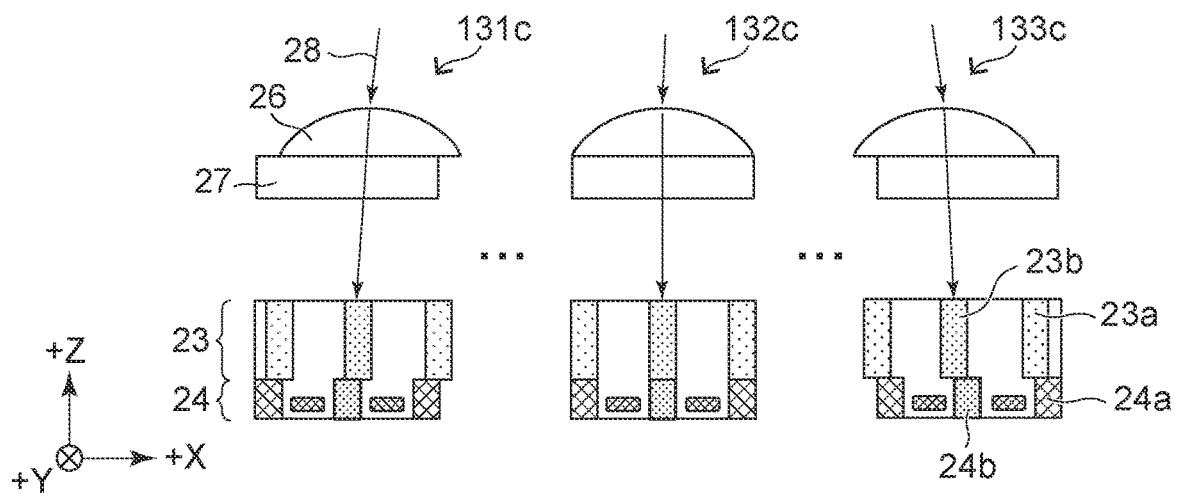

A pixel row 130b in FIG. 13 is a phase-difference AF row for which the shift direction and the shift amount of the isolation regions 23a and 23b are optimized for the lens with the medium pupil distance illustrated in FIG. 12B. As illustrated in FIG. 14B, the isolation regions 23a and 23b are not shifted and are located at the "same positions" as the isolation regions 24a and 24b, respectively.

A pixel row 130c in FIG. 13 is a phase-difference AF row for which the shift direction and the shift amount of the isolation regions 23a and 23b are optimized for the lens with the long pupil distance illustrated in FIG. 12C. As illustrated in FIG. 14C, the isolation regions 23a and 23b are shifted to become closer to the center of the imaging region 1.

The pixel rows 130a, 130b, and 130c that are optimized for different pupil distances in the manner as described above are repeatedly arranged at predetermined intervals in the imaging region 1. Phase-difference AF can be performed in the entire imaging region 1, and pixel rows for use in phase-difference AF are selectable in accordance with pupil distance information of the attached imaging lens.

For example, when the imaging lens with the short pupil distance is attached to the camera, phase-difference AF is performed using an image generated from only the outputs of the plurality of pixel rows 130a.

In one embodiment, when the imaging lens with the medium pupil distance is attached to the camera, phase-difference AF is performed using an image generated from only the outputs of the plurality of pixel rows 130b. Likewise, when the imaging lens with the long pupil distance is attached to the camera, phase-difference AF is performed using an image generated from only the outputs of the plurality of pixel rows 130c.

By selecting rows from which signals for phase-difference AF are read out in the photoelectric conversion apparatus in accordance with the pupil distance of the attached imaging lens in this manner, phase-difference AF with higher accuracy can be performed.

In the present embodiment, the shift direction and the shift amount of the isolation regions 23a and 23b are changed in units of rows. However, the microlenses 26 are not shifted and are disposed at uniform intervals in the X direction and in the Y direction in the imaging region 1. If the positions of the microlenses 26 are changed in accordance with shifting of the corresponding isolation regions 23a and 23b, an optical pixel array is distorted. For example, when a linear pattern extending vertically (in the Y direction) is imaged, the outline may become rough, which may cause degradation of the image quality. By arranging the microlenses 26 at uniform intervals as in the present embodiment, the accuracy of phase-difference AF can be improved without degrading the quality of a captured image.

Sixth Embodiment

Figure 15:
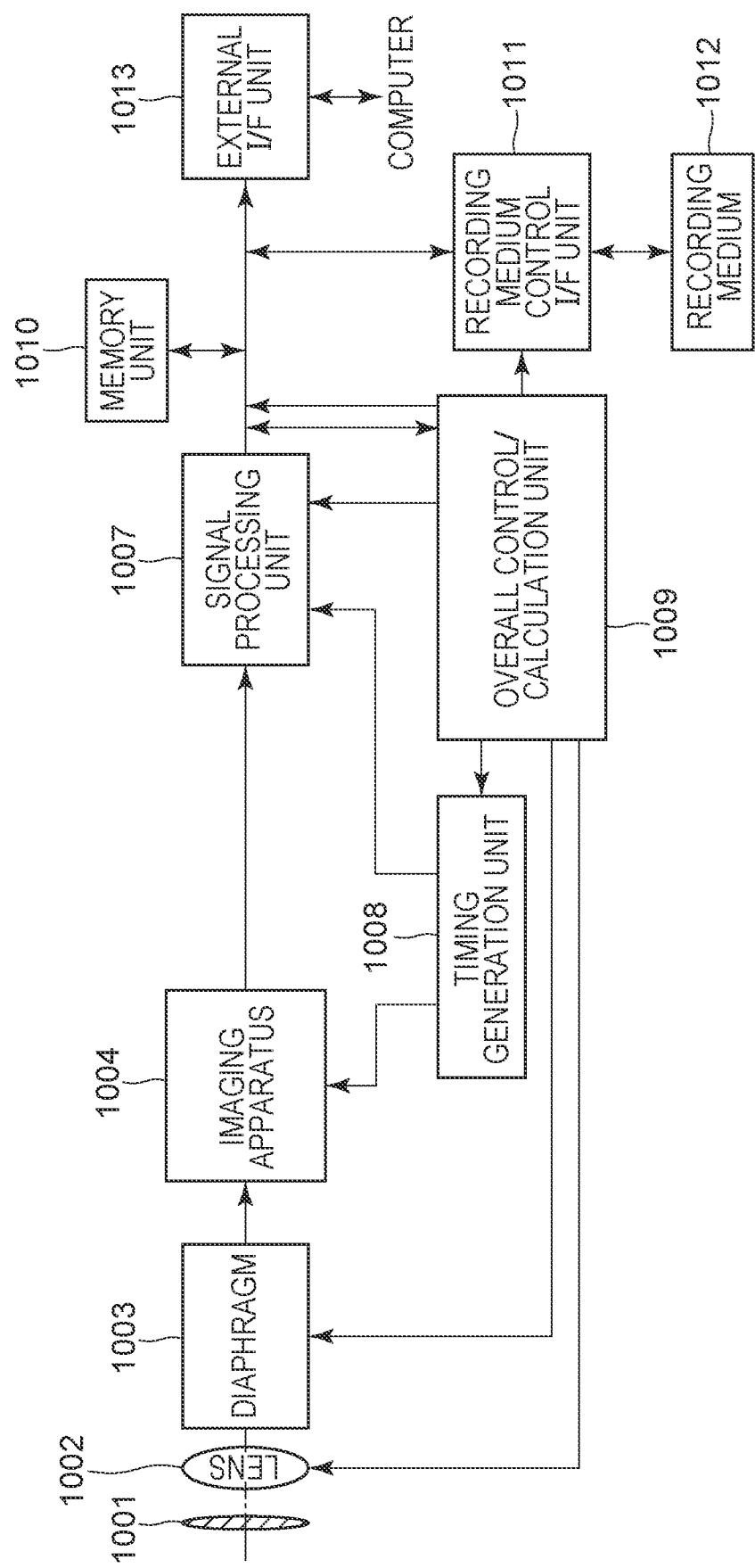
FIG. 15 is a diagram illustrating a configuration of a photoelectric conversion system according to a sixth embodiment.

A photoelectric conversion system according to the present embodiment will be described with reference to FIG. 15. FIG. 15 is a block diagram illustrating a schematic configuration of the photoelectric conversion system according to the present embodiment.

The photoelectric conversion apparatus (imaging apparatus) described in the first to fifth embodiments above can be employed in various photoelectric conversion systems. Examples of the photoelectric conversion systems that can employ the photoelectric conversion apparatus include a digital still camera, a digital camcorder, a surveillance camera, a copier, a fax, a mobile phone, an on-vehicle camera, an observation satellite, etc. The examples of the photoelectric conversion systems also include a camera module that includes the imaging apparatus and an optical system such as a lens. FIG. 15 is a block diagram of a digital still camera which is one of these examples.

The photoelectric conversion system illustrated in FIG. 15 includes an imaging apparatus 1004, which is an example of the photoelectric conversion apparatus, and a lens 1002 that forms an optical image of a photographic subject on the imaging apparatus 1004. The photoelectric conversion system further includes a diaphragm 1003 that makes an amount of light that passes through the lens 1002 variable, and a barrier 1001 that protects the lens 1002. The lens 1002 and the diaphragm 1003 are an optical system that condenses light onto the imaging apparatus 1004. The imaging apparatus 1004 is the photoelectric conversion apparatus (imaging apparatus) according to any of the embodiments described above, and converts the optical image formed by the lens 1002 into an electric signal.

The photoelectric conversion system also includes a signal processing unit 1007 which is an image generation unit that processes an output signal output from the imaging apparatus 1004 to generate an image. The signal processing unit 1007 performs an operation of performing various corrections and compression as needed and outputting image data. The signal processing unit 1007 may be formed on a semiconductor substrate having the imaging apparatus 1004 or on a semiconductor substrate different from a semiconductor substrate having the imaging apparatus 1004.

The photoelectric conversion system further includes a memory unit 1010 for temporarily storing image data, and an external interface unit (external I/F unit) 1013 for communicating with an external computer or the like. The photoelectric conversion system further includes a recording medium 1012, such as a semiconductor memory, to which image data is recorded or from which image data is read, and a recording medium control interface unit (recording medium control I/F unit) 1011 that records image data to or reads image data from the recording medium 1012. Note that the recording medium 1012 may be built in or detachably mounted to the photoelectric conversion system.

The photoelectric conversion system further includes an overall control/calculation unit 1009 that performs various calculations and controls the entire digital still camera, and a timing generation unit 1008 that outputs various timing signals to the imaging apparatus 1004 and the signal processing unit 1007. The timing signals or the like may be input from outside. Thus, the photoelectric conversion system is to include at least the imaging apparatus 1004 and the signal processing unit 1007 that processes an output signal output from the imaging apparatus 1004.

The imaging apparatus 1004 outputs an imaging signal to the signal processing unit 1007. The signal processing unit 1007 performs predetermined signal processing on the imaging signal output from the imaging apparatus 1004, and outputs image data. The signal processing unit 1007 generates an image by using the imaging signal.

As described above, according to the present embodiment, a photoelectric conversion system that employs the photoelectric conversion apparatus (imaging apparatus) according to any of the embodiments above can be implemented.

Seventh Embodiment

Figure 16A:
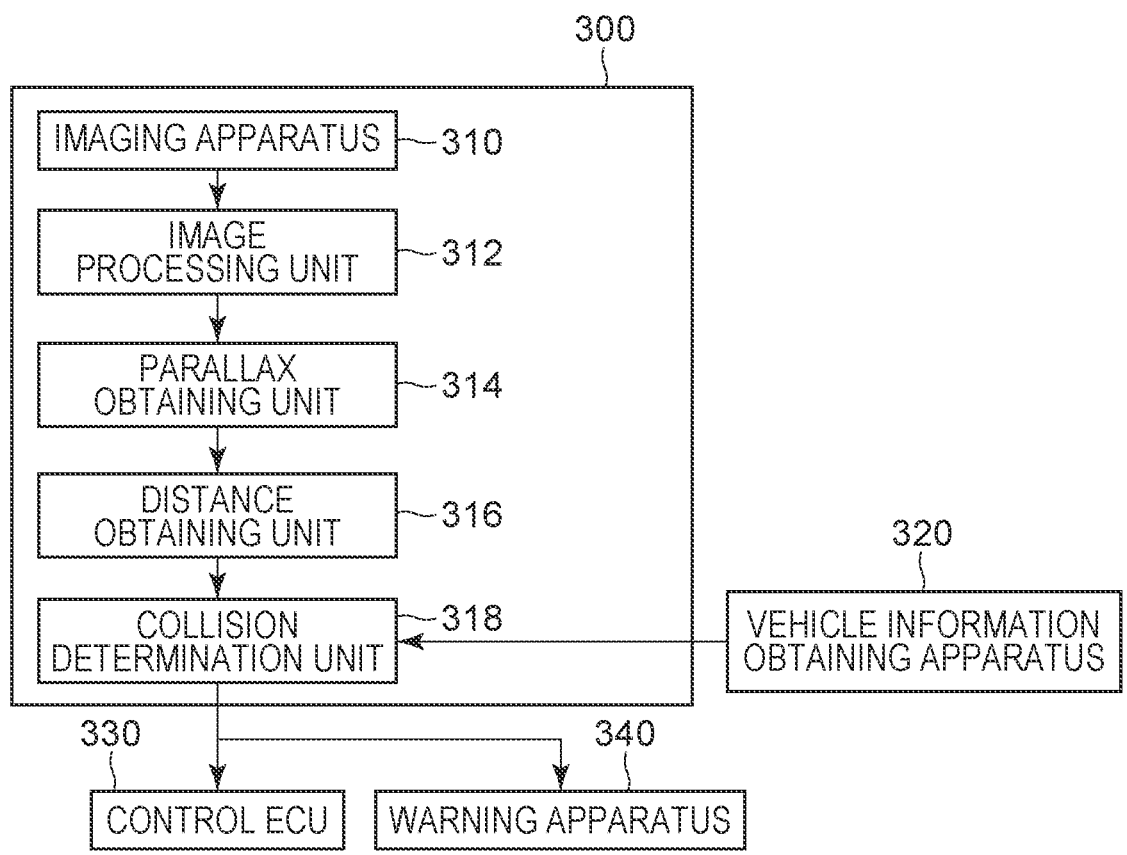
FIGS. 16A and 16B are diagrams illustrating a configuration and an operation of a moving body according to a seventh embodiment.
Figure 16B:
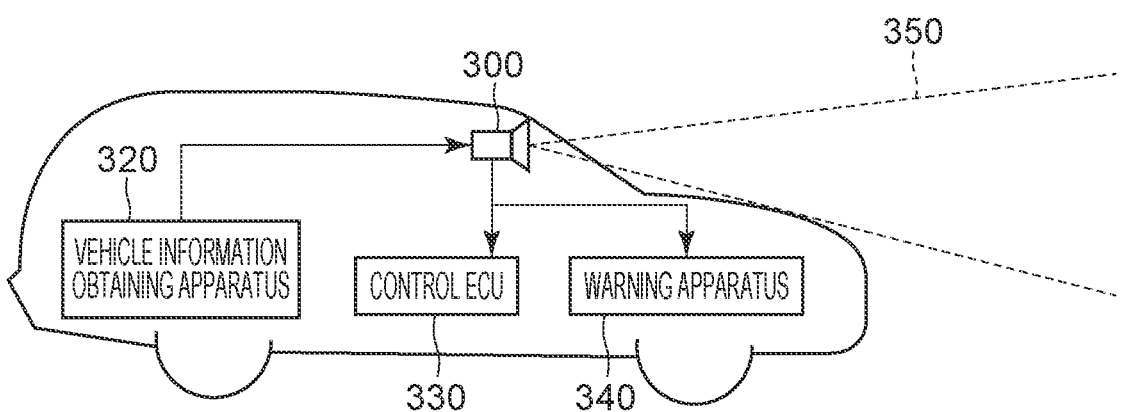

A photoelectric conversion system and a moving body according to the present embodiment will be described with reference to FIGS. 16A and 16B. FIGS. 16A and 16B are diagrams illustrating configurations of the photoelectric conversion system and the moving body according to the present embodiment.

FIG. 16A illustrates an example of a photoelectric conversion system related to an on-vehicle camera. A photoelectric conversion system 300 includes an imaging apparatus 310. The imaging apparatus 310 is the photoelectric conversion apparatus (imaging apparatus) according to any of the embodiments above. The photoelectric conversion system 300 includes an image processing unit 312 that performs image processing on a plurality of pieces of image data obtained by the imaging apparatus 310, and a parallax obtaining unit 314 that calculates parallax (a phase difference between parallax images) from the plurality of pieces of image data obtained by the photoelectric conversion system 300. The photoelectric conversion system 300 also includes a distance obtaining unit 316 that calculates a distance to a target object on the basis of the calculated parallax, and a collision determination unit 318 that determines whether there is a possibility of collision on the basis of the calculated distance. The parallax obtaining unit 314 and the distance obtaining unit 316 are an example of a distance information obtaining unit that obtains distance information on a distance to a target object. That is, the distance information is information related to parallax, a defocus amount, a distance to a target object, or the like. The collision determination unit 318 may determine a possibility of collision by using any of these pieces of distance information. The distance information obtaining unit may be implemented by dedicatedly designed hardware or by a software module. The distance information obtaining unit may be implemented by a field programmable gate array (FPGA), an application specific integrated circuit (ASIC), or the like, or by any combination of these.

The photoelectric conversion system 300 is connected to a vehicle information obtaining apparatus 320 and is capable of obtaining vehicle information such as a vehicle speed, a yaw rate, and a steering angle. The photoelectric conversion system 300 is connected to a control electronic control unit (ECU) 330 that is a control unit that outputs a control signal for generating a braking force to a vehicle on the basis of a determination result obtained by the collision determination unit 318. The photoelectric conversion system 300 is also connected to a warning apparatus 340 that issues a warning to a driver on the basis of the determination result obtained by the collision determination unit 318. For example, when the determination result obtained by the collision determination unit 318 indicates a high possibility of collision, the control ECU 330 controls the vehicle to avoid a collision or decrease a damage by braking, returning an accelerator, suppressing an engine output, or the like. The warning apparatus 340 issues a warning to a user by outputting warning sound or the like, displaying warning information on a screen of a car navigation system or the like, or vibrating a seatbelt or a steering wheel.

In the present embodiment, the photoelectric conversion system 300 captures images of an area around the vehicle, for example, an area in front of or behind the vehicle. FIG. 16B illustrates the photoelectric conversion system 300 in the case where images of an area (to-be-imaged area 350) in front of the vehicle are captured. The vehicle information obtaining apparatus 320 sends an instruction to the photoelectric conversion system 300 or the imaging apparatus 310. With such a configuration, the ranging accuracy can be increased further.

An example of controlling the vehicle to avoid a collision with another vehicle has been described above. However, the photoelectric conversion system 300 is applicable to control for performing automated driving to follow another vehicle, control for performing automated driving so as not to run out of the lane, or the like. Further, the photoelectric conversion system 300 is also applicable to a moving body (moving apparatus) such as a ship, an aircraft, or an industrial robot as well as the vehicle such as an automobile. In addition, the photoelectric conversion system 300 is also applicable to a wide variety of devices that use object recognition, such as Intelligent Transport Systems (ITS), as well as the moving body.

MODIFIED EMBODIMENTS

The disclosure is not limited to the embodiments described above, and various modifications can be made.

For example, an example in which part of the configuration according to any of the embodiments is added to another embodiment or an example in which part of the configuration according to any of the embodiments is replaced with part of the configuration of another embodiment are also included in embodiments of the disclosure.

Circuitry in each of the embodiments of the disclosure may be formed using a single semiconductor substrate, or may be disposed on or in two or more semiconductor substrates, which may be adhered together to form a layered structure. For example, a layered structure constituted by three or more substrates may be formed by dividing the circuitry, adding circuitry or functions, or the like.

The photoelectric conversion systems according to the sixth and seventh embodiments described above are merely examples of the photoelectric conversion system that can employ the photoelectric conversion apparatus. Thus, the photoelectric conversion system that can employ the photoelectric conversion apparatus according to the embodiments of the disclosure is not limited to the configurations illustrated in FIGS. 15 to 16B.

The above embodiments are merely specific examples for carrying out the disclosure, and the technical scope of the disclosure should not be limited by these embodiments.

That is, the disclosure can be carried out in various forms without deviating from the technical scope or main features thereof.

While the disclosure has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2021-017516, filed Feb. 5, 2021, which is hereby incorporated by reference herein in its entirety.

What is claimed is:

1. An apparatus comprising:
a plurality of pixels on a substrate, wherein
each of the plurality of pixels includes
a first portion,
a second portion, and
a microlens,
the substrate
has a first surface on an incidence side and a second surface opposite to the first surface, and
includes
an inter-pixel portion isolating adjacent pixels from each other among the plurality of pixels, and
an intra-pixel portion isolating the first portion and the second portion from each other,
the inter-pixel portion includes
a first region located adjacently to the first surface in plan view from the first surface, and
a second region located adjacently to the second surface,
the first region is shifted with respect to the second region,
the intra-pixel portion includes
a third region located adjacently to the first surface, and
a fourth region located adjacently to the second surface,
the third region is shifted with respect to the fourth region in a direction identical to a shift direction of the first region, and
the shift direction is a direction orthogonal to a longitudinal direction of the intra-pixel portion in plan view from the first surface.

2. The apparatus according to claim 1, wherein a shift amount of the third region from the fourth region is equal to a shift amount of the first region from the second region.

3. The apparatus according to claim 1, wherein an area of a light-receiving surface of the first portion and an area of a light-receiving surface of the second portion are equal to each other.

4. The apparatus according to claim 1, wherein each of the plurality of pixels includes a transistor configured to transfer charge to a region adjacent to the second surface.

5. The apparatus according to claim 1, wherein the first region and the second region form a portion that is continuous from a surface, adjacent to the first surface, of a portion among the first and second portions to a surface, adjacent to the second surface, of the portion.

6. The apparatus according to claim 1, wherein a region among the first to fourth regions is a trench or a potential barrier formed through doping with an impurity.

7. The apparatus according to claim 1, wherein a structure located between the microlens and the first and second portions is shifted in the shift direction of the first region.

8. The apparatus according to claim 1, wherein a portion isolated by a boundary portion of the first region and the second region includes a boundary portion constituted by a portion doped with an impurity and a portion not doped with any impurity.

9. The apparatus according to claim 1, further comprising:
a region in which the plurality of pixels are arranged in an array form,
the region includes
a first sub-region, and
a second sub-region,
a shift direction or a shift amount of the first region of a plurality of pixels in the first sub-region among the plurality of pixels and a shift direction or a shift amount of the first region of a plurality of pixels in the second sub-region among the plurality of pixels are different from each other.

10. The apparatus according to claim 9, wherein the first sub-region is a central portion of the region, and the second sub-region is a peripheral portion of the region.

11. The apparatus according to claim 9, wherein the first sub-region is a first row in the region, and the second sub-region is a second row different from the first row in the region.

12. The apparatus according to claim 11, wherein the first row and the second row correspond to respective pupil distances different from each other.

13. The apparatus according to claim 11, wherein signals output from pixels in the first row are read out.

14. The photoelectric conversion apparatus according to claim 1, wherein the microlenses are arranged at uniform intervals.

15. The apparatus according to claim 1, wherein
in the plurality of pixels,
impurity regions adjacent to the second surface are arranged at certain intervals, and
intervals at which impurity regions adjacent to the first surface are arranged are different from each other.

16. A system comprising:
the apparatus according to claim 1; and
a processing unit configured to generate an image by using an output by the apparatus.

17. The system according to claim 16, wherein the apparatus further comprises:
a region in which the plurality of pixels are arranged in an array form,
the region includes
a first sub-region, and
a second sub-region,
a shift direction or a shift amount of the first region of a plurality of pixels in the first sub-region among the plurality of pixels and a shift direction or a shift amount of the first region of a plurality of pixels in the second sub-region among the plurality of pixels are different from each other.

18. A moving body comprising:
the apparatus according to claim 1; and
a control unit configured to control movement of the moving body by using an output by the apparatus.

19. The moving body according to claim 18, wherein the apparatus further comprises:
a region in which the plurality of pixels are arranged in an array form,
the region includes
a first sub-region, and
a second sub-region,
a shift direction or a shift amount of the first region of a plurality of pixels in the first sub-region among the plurality of pixels and a shift direction or a shift amount of the first region of a plurality of pixels in the second sub-region among the plurality of pixels are different from each other.

20. A substrate having a plurality of pixels, a first surface on an incidence side, and a second surface opposite to the first surface,
each of the plurality of pixels including
a first portion, and
a second portion,
the substrate comprising:
an inter-pixel portion isolating adjacent pixels from each other among the plurality of pixels; and
an intra-pixel portion isolating the first portion and the second portion from each other, wherein
the inter-pixel portion includes
a first region located adjacently to the first surface in plan view from the first surface, and
a second region located adjacently to the second surface,
the first region is shifted with respect to the second region,
the intra-pixel portion includes
a third region located adjacently to the first surface, and
a fourth region located adjacently to the second surface,
the third region is shifted with respect to the fourth region in a direction identical to a shift direction of the first region, and
the shift direction is a direction orthogonal to a longitudinal direction of the intra-pixel portion in plan view from the first surface.

* * * * *